US012787175B2

(12) United States Patent
Mentovich et al.

(10) Patent No.: US 12,787,175 B2
(45) Date of Patent: Nov. 3, 2026

(54) SECURE ELECTRONIC COMPONENT ASSEMBLY

(71) Applicant: NVIDIA CORPORATION, Santa Clara, CA (US)

(72) Inventors: Elad Mentovich, Tel Aviv (IL); Dongji Xie, Gilroy, CA (US); Ron Chao, San Diego, CA (US); Ryan Albright, Beaverton, OR (US)

(73) Assignee: NVIDIA CORPORATION, Santa Clara, CA (US)

( * ) Notice: Subject to any disclaimer, the term of this patent is extended or adjusted under 35 U.S.C. 154(b) by 243 days.

(21) Appl. No.: 18/242,290

(22) Filed: Sep. 5, 2023

(65) Prior Publication Data

US 2025/0081349 A1 Mar. 6, 2025

(51) Int. Cl.

*H05K 1/181* (2026.01)
*H05K 1/02* (2006.01)
*H05K 3/12* (2006.01)
*H05K 3/28* (2006.01)

(52) U.S. Cl.

CPC ........... *H05K 1/181* (2013.01); *H05K 1/0275* (2013.01); *H05K 1/0293* (2013.01); *H05K 3/1283* (2013.01); *H05K 3/284* (2013.01)

(58) Field of Classification Search

None

See application file for complete search history.

(56) References Cited

U.S. PATENT DOCUMENTS 2,218,274 A * 10/1940 Wood ................. H01H 85/0454 337/225
4,860,351 A * 8/1989 Weingart ................ G06F 21/86 380/52
5,096,724 A * 3/1992 Zenner ................... A23B 2/717 426/124
5,156,322 A * 10/1992 Do-Thoi ............... C04B 37/026 228/198
5,535,101 A * 7/1996 Miles .................... H10W 70/68 257/E23.125
5,834,339 A * 11/1998 Distefano ............... H10P 72/74 438/118

(Continued)

FOREIGN PATENT DOCUMENTS

CN 217277642 U * 8/2022
JP 2000040776 A * 2/2000
WO 2009047585 A1 4/2009

OTHER PUBLICATIONS

Caplan et al., Pending U.S. Appl. No. 18/110,639, filed Feb. 16, 2023.

(Continued)

*Primary Examiner* — Krystal Robinson
(74) *Attorney, Agent, or Firm* — Alston & Bird LLP

(57) ABSTRACT

A secure electronic component assembly is described herein for ensuring the physical integrity of an integrated circuit (IC). The secure electronic component assembly may comprise a printed circuit board (PCB), an integrated circuit (IC) mounted on the PCB, and an underfill material disposed between the IC and the PCB. The underfill material comprises a detection agent that is configured to change a state of the IC in response to exposure to an external environment, wherein the change in the state of the IC is indicative of a tamper condition.

18 Claims, 2 Drawing Sheets

(56) References Cited

U.S. PATENT DOCUMENTS

| | | | | |
|---|---|---|---|---|
| 5,920,112 | A * | 7/1999 | Datri | H10W 74/131 257/667 |
| 6,372,544 | B1 * | 4/2002 | Halderman | H10W 72/30 257/E21.503 |
| 6,373,142 | B1 * | 4/2002 | Hoang | H10W 72/0113 257/E21.503 |
| 6,566,234 | B1 * | 5/2003 | Capote | B23K 35/025 438/458 |
| 6,733,902 | B2 * | 5/2004 | Sumita | C08G 59/306 257/793 |
| 11,097,511 | B2 * | 8/2021 | Zhao | B32B 9/005 |
| 11,599,703 | B2 | 3/2023 | Finkelstein et al. | |
| 11,640,933 | B2 | 5/2023 | Vilner et al. | |
| 12,030,139 | B2 * | 7/2024 | Chuang | C22C 13/00 |
| 2002/0025602 | A1 * | 2/2002 | Jiang | H10W 72/013 257/E21.503 |
| 2004/0150967 | A1 * | 8/2004 | Danvir | H05K 3/305 361/767 |
| 2005/0029666 | A1 * | 2/2005 | Kurihara | C04B 37/026 257/772 |
| 2007/0016963 | A1 * | 1/2007 | Robinson | G07F 7/10 726/34 |
| 2007/0177363 | A1 * | 8/2007 | Jayanetti | G06F 21/86 361/760 |
| 2007/0205521 | A1 * | 9/2007 | Robinson | H10W 74/40 257/E23.117 |
| 2008/0129501 | A1 * | 6/2008 | Tucker | G08B 13/06 340/550 |
| 2008/0203564 | A1 * | 8/2008 | Motoyoshi | H05K 1/0271 438/117 |
| 2010/0213590 | A1 * | 8/2010 | Warren | H10W 42/405 438/118 |
| 2015/0192637 | A1 | 7/2015 | Falk et al. | |
| 2015/0282329 | A1 * | 10/2015 | Baker | C09J 5/00 264/261 |
| 2016/0106635 | A1 * | 4/2016 | Yan | A61K 8/11 424/401 |
| 2017/0141071 | A1 * | 5/2017 | Choi | H10W 70/093 |
| 2019/0013281 | A1 | 1/2019 | Elenes et al. | |
| 2021/0114842 | A1 * | 4/2021 | Palazzola | B66B 7/1223 |
| 2021/0242102 | A1 * | 8/2021 | Nofen | C08K 3/16 |
| 2023/0121874 | A1 | 4/2023 | Bakopoulos et al. | |
| 2025/0079344 | A1 | 3/2025 | Mentovich et al. | |

OTHER PUBLICATIONS

Oren et al., Pending U.S. Appl. No. 18/198,890, filed May 18, 2023.

Vasile et al., “Temperature Sensitive Active Tamper Detection Circuit,” IEEE 23rd International Symposium for Design and Technology in Electric Packaging (SIITME); 4 pages, (Year: 2017).

* cited by examiner

SECURE ELECTRONIC COMPONENT ASSEMBLY

TECHNOLOGICAL FIELD

Example embodiments of the present disclosure relate to a secure electronic component assembly and, more particularly, to an electronic component assembly that includes an underfill material with a detection agent for ensuring the physical integrity of an integrated circuit (IC).

BACKGROUND

With the steady and relentless advancement in technology, the functionality and complexity of Integrated Circuits (ICs) have grown exponentially. As foundational building blocks for most technologies, ICs have become a primary target for malicious tampering activities that aim to alter, steal, or disrupt the functions the ICs control. Tampering with ICs poses severe security risks, such as unauthorized access to sensitive data, interruption of critical services, manipulation of a device's functionality, and/or the like. Given these challenges, there is a pressing need for a secure electronic component assembly that can protect the integrity of the ICs upon detecting a tampering condition.

Applicant has identified a number of deficiencies and problems associated with current electronic component assemblies for ensuring the physical integrity of an IC. Many of these identified problems have been solved by developing solutions that are included in embodiments of the present disclosure, many examples of which are described in detail herein.

BRIEF SUMMARY

Systems and methods are provided for an electronic component assembly for ensuring the physical integrity of an integrated circuit (IC).

In some embodiments, a secure electronic component assembly is presented. The assembly comprising: a printed circuit board (PCB); an integrated circuit (IC) mounted on the PCB; and an underfill material disposed between the IC and the PCB, wherein the underfill comprises a detection agent configured to change a state of the IC in response to exposure to an external environment, wherein the change in the state of the IC is indicative of a tamper condition.

In some embodiments, the change in the state of the IC comprises a change from a functional state of the IC to a non-functional state of the IC.

In some embodiments, the non-functional state of the IC is caused by a short-circuit between one or more internal connections in the IC.

In some embodiments, the non-functional state of the IC is caused by physical degradation of the IC.

In some embodiments, the non-functional state of the IC is caused by an alteration in one or more electrical properties of the IC.

In some embodiments, the detection agent comprises at least one of an oxidization agent or a chemical agent.

In some embodiments, the detection agent is configured to change a chromatic appearance of the IC in response to exposure to the external environment, and wherein the change of the chromatic appearance is indicative of a tamper condition.

In some embodiments, the assembly further comprises: a plurality of solder balls operatively coupled to the IC, wherein the plurality of solder balls is configured for physical and electrical connection between the IC and the PCB.

In some embodiments, the underfill material, once cured, encapsulates the plurality of solder balls, forming a mechanical and thermal bridge that provides mechanical reinforcement, stress redistribution, and enhanced thermal conductivity between the IC and the PCB.

In another aspect, a method for making a secure electronic component assembly is presented. The method comprising: providing a printed circuit board (PCB) comprising a plurality of pads; mounting an integrated circuit (IC) onto the PCB by positioning a plurality of solder balls in alignment with the plurality of pads and disposing the IC on the plurality of solder balls so as to operatively couple the IC and the PCB; and applying an underfill material comprising a detection agent between the IC and the PCB, such that the underfill material is in contact with the plurality of solder balls and the PCB, wherein the detection agent is configured to change a state of the IC in response to exposure to an external environment, wherein the change in the state of the IC is indicative of a tamper condition.

The above summary is provided merely for purposes of summarizing some example embodiments to provide a basic understanding of some aspects of the present disclosure. Accordingly, it will be appreciated that the above-described embodiments are merely examples and should not be construed to narrow the scope or spirit of the disclosure in any way. It will be appreciated that the scope of the present disclosure encompasses many potential embodiments in addition to those here summarized, some of which will be further described below.

BRIEF DESCRIPTION OF THE DRAWINGS

Having thus described embodiments of the disclosure in general terms, reference will now be made the accompanying drawings. The components illustrated in the figures may or may not be present in certain embodiments described herein. Some embodiments may include fewer (or more) components than those shown in the figures.

Figure 1:
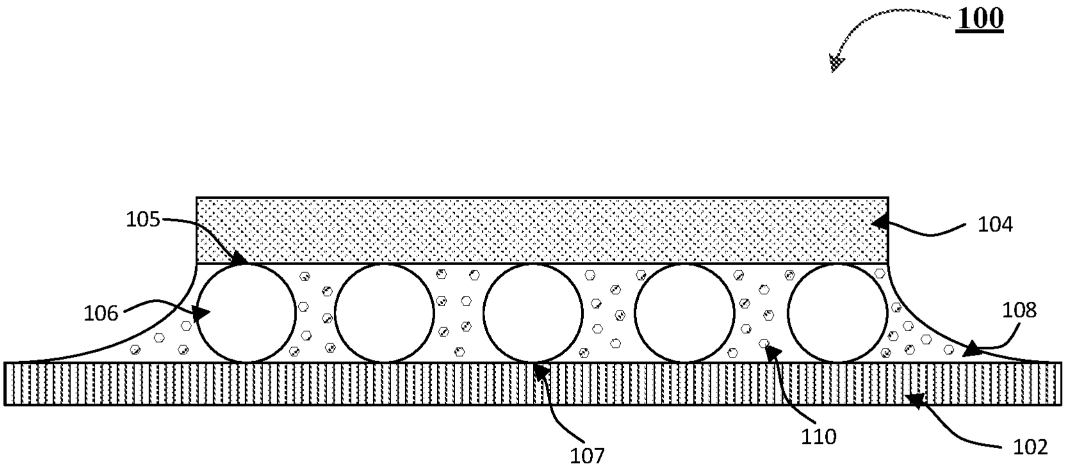
Figure 2:
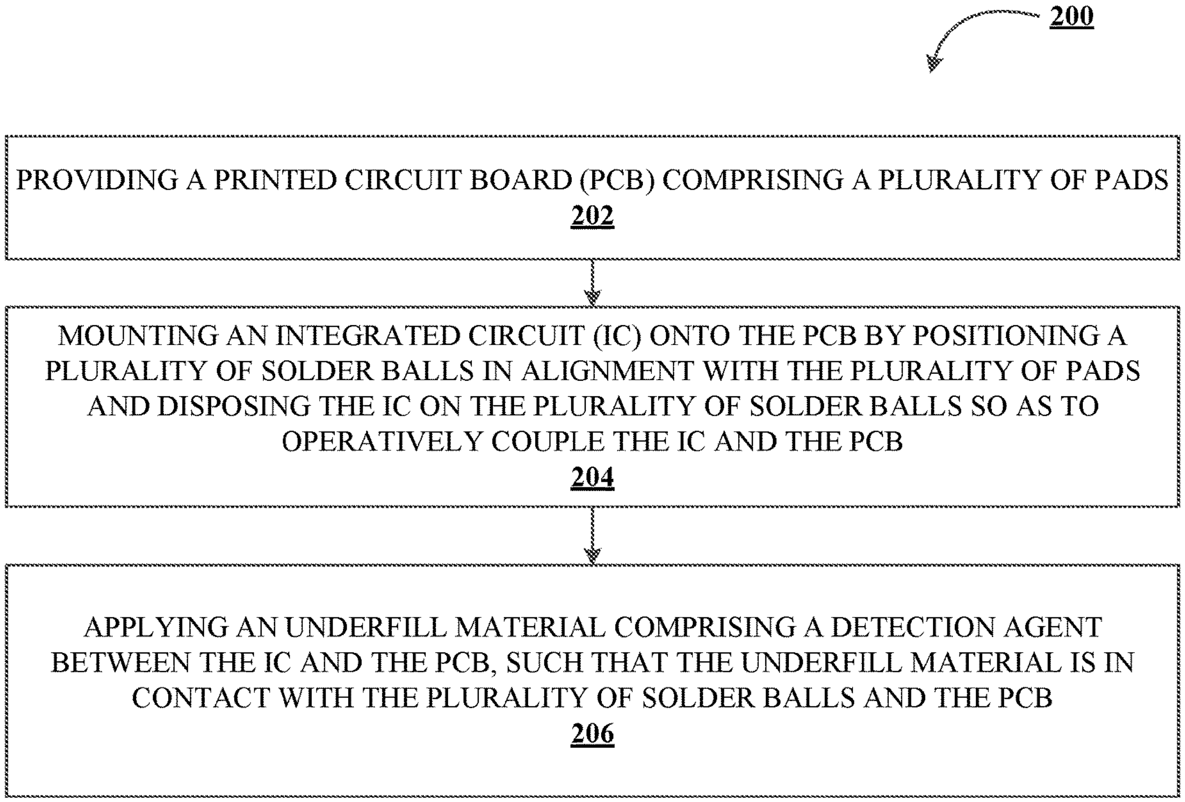

FIG. 1 illustrates a secure electronic component assembly, in accordance with an embodiment of the invention; and FIG. 2 illustrates a method for ensuring the physical integrity of an IC using an underfill material with a detection agent, in accordance with an embodiment of the invention.

DETAILED DESCRIPTION

Overview

Unauthorized removal and reuse of Integrated Circuits (ICs) from Printed Circuit Boards (PCBs) by unauthorized parties is a pressing problem in the electronics industry. This problem involves the risk of intellectual property theft as these ICs, once removed, can be analyzed and reverse-engineered, resulting in unfair competition and potential loss of profitability for the original manufacturers. Additionally, these components can be utilized to produce counterfeit electronics, which often suffer from poor performance and premature failure and can pose safety issues. This can result in a negative customer experience and can tarnish the reputation of the original manufacturers. Further challenges arise in terms of quality control and data security. The ICs removed might not have undergone the necessary quality checks and could have been damaged during the extraction process, leading to unreliable products. Moreover, these ICs often contain data storage elements, thus posing significant risks of data breaches and potential leaks of sensitive information. From an economic perspective, these issues can cause significant loss for companies that have invested heavily in research, development, and production of their electronics, only to see their components reused without authorization.

The process of mounting an IC on to a PCB typically includes positioning the IC on the PCB such that the solder balls on the underside of the IC align with the pattern of connection pads on the PCB. Once positioned, heat is applied to melt the solder balls, allowing them to form robust electrical and mechanical connections with the corresponding pads on the PCB. Subsequently, an underfill material is applied in the space between the IC and the PCB. This underfill material is a specific type of epoxy, selected for its fluidity and curing properties. The underfill material seeps into the gap between the IC and the PCB that is created by the presence of the solder balls, thereby encasing the now solidified solder balls and the lower section of the IC. Once cured, the underfill material provides additional mechanical strength to the bond between the IC and the PCB, helps distribute any thermal stress evenly across the IC, and acts as a protective barrier, safeguarding the IC and the delicate solder joints from environmental factors such as moisture, dust, and corrosive agents. An unauthorized person typically removes an IC from the PCB by stripping the underfill material by either chipping away at the underfill material or dissolving the underfill material altogether using an appropriate solvent.

The problems described above may addressed in multiple ways. One such solution, as detailed in an associated patent application incorporated herein by reference at the end of the section, involves the use of a security chip to ensure the preservation of an Integrated Circuit's (IC) physical integrity. In another solution described herein, the underfill material may include a detection agent. When an unauthorized user strips the underfill material to remove the IC, the detection agent present within the underfill material is exposed to an external environment. In some embodiments, in response to exposure to the external environment, the detection agent renders the IC non-functional for its intended use. As described in greater detail below, in one example, when exposed to an external environment, the detection agent may cause a short-circuit between internal connections in the IC, thereby rendering the IC non-functional for its intended use. In another example, when exposed to the external environment, the detection agent may cause physical degradation of the IC, again rendering the IC non-functional for its intended use. In yet another example, when exposed to the external environment, the detection agent may alter one or more electrical properties of the IC, thereby rendering the IC non-functional for its intended use. In yet another example, when exposed to the external environment, the detection agent may induce chromatic alteration in the contacted materials, thereby providing a visual indication that the IC is non-functional for its intended use. In this way, embodiments of the present invention may ensure that an IC is non-functional if an unauthorized person attempts to remove the IC from the PCB.

Example Secure Electronic Component Assembly

FIG. 1 illustrates a secure electronic component assembly 200, in accordance with an embodiment of the invention. As shown in FIG. 1, the secure electronic component assembly 200 may include a printed circuit board (PCB) 102, an IC 104 mounted on the PCB 102, and an underfill material 108 that is applied in the space between the IC 104 and the PCB 102. The underfill material 108 may include one or more detection agents 110 that are used to protect the integrity of the IC 104 in instances where the IC 104 is removed by an unauthorized person.

The IC 104 may be mounted on the PCB 102 to establish both physical and electrical connections therewith through a plurality of solder balls 106. The solder balls 106 may serve as a primary point of contact between the IC 104 and the PCB 102. The solder balls 106 may be arranged in a grid-like pattern and strategically positioned on the underside of the IC 104. The solder balls 106 may, for example, be made from a lead-tin alloy or a lead-free alternative, chosen for its favorable properties such as high electrical conductivity and melting point suitable for establishing a strong, reliable, and conductive connection. In example embodiments, the solder balls 106 may be placed onto specific points, often referred to as solder pads 105, on the bottom side of the IC 104 in a uniform and predetermined pattern, typically corresponding to the layout of contact points (e.g., pads) 107 on the PCB 102, thereby ensuring accurate alignment and connection between the IC and the PCB. When the IC 104 is placed onto the PCB 102, the solder balls 106 align with corresponding contact points 107 on the PCB 102. Once aligned, the IC 104 and the PCB 102 are subject to a soldering process (e.g., a reflow process) in which the solder balls 106 are heated to a temperature that exceeds the melting point of the solder material, causing the solder balls 106 to melt and subsequently, upon cooling, solidify to form robust mechanical and electrical connections between the IC 104 and the PCB 102.

As shown in FIG. 1, upon mounting the IC 104 onto the PCB 102, an underfill material 108 may be applied in the space between the IC 104 and the PCB 102 to distribute thermal and mechanical stresses across the IC 104 and the PCB 102 and add an extra layer of adhesion and protection between the IC 104 and the PCB 102. In some embodiments, the underfill material 108 may be augmented with or include one or more detection agents 110 that may be configured to change the state of the IC 104 when exposed to an external environment, thereby indicating a tamper condition.

In some embodiments, when incorporating detection agents 110 into the underfill material 108, a compatibility assessment may be executed to preclude any premature reactions between the detection agents 110 and the underfill material 108. Upon confirming their compatibility, the detection agents 110 may be blended with the underfill material 108 in a uniform mixture. In example embodiments, such blending may be facilitated by specialized agitators or high-speed mixers, and is often conducted under a controlled, possibly inert, environment to inhibit unintended interactions with external elements such as oxygen and moisture. In some embodiments, the detection agents 110 may be micro-encapsulated to safeguard against premature activation, thereby allowing the agents to be triggered only under specific conditions like unauthorized tampering resulting in exposure to the external environment. In some embodiments, prior to entering the production phase, batch testing may be executed to ascertain the stability and efficacy of the combination of the detection agents 110 and the underfill material 108 and ensure that the composite material (e.g., combination of the detection agents 110 and the underfill material 108) meets all stipulated mechanical, thermal, and reactive specifications. Once tested, the composite material may be dispensed in the gap between the IC 104 and the PCB 102 that is created by the presence of the solder balls 106. In example embodiments, to dispense the composite material, various dispensing techniques may be used, such as automated dispensing systems, jetting technology, screen printing, laser-guided application, and/or the like. In specific embodiments, once dispensed, the curing process that follows may be calibrated to retain the functionality of the detection agents 110. Post-curing, validation tests may be employed to confirm the efficacy of the detection agents 110 in maintaining their functional integrity throughout the lifecycle of the product.

In some embodiments, the change in the state of the IC 104 may be a change from a functional state of the IC 104 to a non-functional state of the IC 104. In its functional state, the IC 104 may behave as prescribed, effectively processing input signals, managing data operations, controlling associated hardware components, and/or the like. When an unauthorized person attempts unauthorized access or tampering of the IC 104, the detection agent 110 may be subject to specific stimuli that trigger certain reactions that change the state of the IC 104 from its operational, functional state to a dormant state, non-functional state, restricted functional state, and/or the like.

In some embodiments, the detection agents may be embedded within the underfill material in such a way that they are fully encapsulated and isolated from the external environment. The encapsulation prevents the detection agents from being exposed to the outer surface of the underfill material. Therefore, the detection agents will not react or oxidize in a normal, non-tampering situation as they are not exposed to the external environment. As described herein, should an unauthorized party attempt to remove the IC from the PCB, they would need to separate the IC from the PCB, an act that necessarily involves the disturbance or removal of the underfill material. Such disturbance invariably results in the exposure of the detection agents to the external environment.

In some embodiments, the detection agent 110 may be an oxidization agent. Should an unauthorized person attempt unauthorized access or tampering of the IC by removing the underfill material 108, this oxidization agent would be exposed to the ambient, oxygen-rich environment. Upon exposure to oxygen, the oxidization agent may instigate a chemical reaction, compromising the functionality of the IC. As a direct result of this reaction, even if the IC 104 were to be extracted following the removal of the underfill material 108, the IC would not execute its designated operations.

In one aspect, the non-functional state of the IC 104 may be caused by a short-circuit between one or more internal connections in the IC 104. Under typical operational conditions, the internal connections within an IC 104 function as conduits for electrical signals, ensuring the systematic and sequential execution of tasks, whether that be processing data, transmitting signals, or any other fundamental IC 104 operations. By intentionally introducing a short circuit among the internal connections, the normal flow of electricity within the IC may be disrupted, thus changing the state of the IC 104 from a functional state to a non-functional state. For example, a short circuit may be facilitated through a number of techniques such as conductive bridging, dielectric breakdown, electrostatic discharge, localized heating, photo-induced conductivity, ion implantation, over-voltage stress, and/or the like.

In another aspect, the non-functional state of the IC may be caused by physical degradation of the IC 104. Here, physical degradation may refer to the purposeful alteration or compromise of the structural integrity of the IC 104 or its core components, leading to a cessation of its standard operations. For example, the transition of the IC 104 from a functional state to a non-functional state may be facilitated through a number of controlled physical degradation techniques such as introducing micro-abrasions on the surface of specific layers of the IC disrupting the flow of electrical signals, deliberate thinning of layers such as oxide barriers or silicon substrates, inducing material fatigue by repeatedly subjecting the IC to stress (e.g., thermal cycling or voltage spikes), chemical etching, introducing contaminants, thermal degradation, photo-degradation by subjecting the IC to high intensity or specific wavelengths of light, electromagnetic interference, nano-porosity induction, and/or the like.

In yet another aspect, the non-functional state of the IC 104 may be caused by an alteration in one or more electrical properties of the IC. In its unaltered state, the electrical properties (e.g., resistance, capacitance, inductance, dielectric constant, and/or the like) of the IC 104 are typically calibrated to ensure optimal performance in specific tasks, such as data processing, signal amplification, frequency modulation, and/or the like. Any deviation in these properties, whether in resistance due to changes in temperature or inductance owing to coil geometry modifications, can disrupt the operational efficacy of the IC 104. For example, resistance variation may be achieved through thermal manipulations, inducing micro-defects within the conductive pathways of the IC 104, or integrating materials with divergent resistive values. Adjustments in capacitance can be realized by modifying the dielectric materials' properties within the IC 104, altering the surface area of associated capacitor plates, or revising their mutual separation. Inductance alterations can be drawn from reconfigurations in coil designs or through the introduction of alternative core materials. Changes in the dielectric constant of the insulating mediums might be provoked by exposing the IC 104 to specific external conditions or frequencies, and/or the like.

In some other embodiments, the one or more detection agents 110 may be chemical agents. In a similar situation where an unauthorized person attempts unauthorized access of tampering of the IC 104 by removing the underfill material 108, these chemical agents would be exposed to an oxygen-rich environment. Upon exposure to oxygen, the chemical agents may initiate a series of reactions which may lead to chromatic alteration—or a distinct change in color—of the materials they encounter. Such a chromatic alteration not only provides an immediate and visible indication of the state of the IC 104, signaling to an observer that the IC is non-functional, but also acts as a deterrent against unauthorized tampering, as it visibly marks the IC, making any unauthorized interventions evident. In one example, the chemical agent may include tamper-evident dyes such as crystal violet lactone, which, in response to exposure to certain solvents or environmental conditions, undergoes a color change that could indicate a tamper condition. Other dyes such as leuco dyes or pH-sensitive dyes can also be used for this purpose. In another example, the chemical agent may include an encapsulated acid-base indicator that usually remains stable within the underfill material, but when exposed to a specific solvent or when the encapsulation is broken, reacts and undergoes a color change that could indicate a tamper condition. In yet another example, the chemical agent may include moisture sensitive reactive compounds that may react to humidity or moisture and generate corrosive byproducts that could be used to cause irreversible changes in the IC's functionality.

Example Methods for Making a Secure Electronic Component Assembly

FIG. 2 illustrates a method 200 for ensuring the physical integrity of an IC using a an underfill material with a detection agent, in accordance with an embodiment of the invention. As shown in block 202, the method may include providing a PCB comprising a plurality of pads. In example embodiments, the PCB may be designed to serve as the primary substrate or base for mounting various electronic components. The PCB may include a plurality of pads that may be strategically positioned on the surface of the PCB to facilitate effective electrical connections. Each pad may be generally fabricated from conductive materials, such as copper, and can be plated or coated with materials such as gold, tin, or silver to ensure reliable and corrosion-resistant connections. The design and layout of the pads may vary based on the intended application of the PCB. The pads may be arranged in linear arrays, grid formations, or other configurations, as the specific electronic assembly demands. The pads' size, shape, and spacing are typically compatible with the connection requirements of the intended electronic components, ensuring optimal electrical conductivity and mechanical stability.

As shown in block 204, the method may include mounting an integrated circuit (IC) onto the PCB by positioning a plurality of solder balls in alignment with the plurality of pads and disposing the IC on the plurality of solder balls so as to operatively couple the IC and the PCB. As described herein, the IC may be equipped with a plurality of solder balls on its underside. The arrangement of the solder balls on the IC may mirror the layout of the pads on the PCB, thereby ensuring a one-to-one correspondence between each solder ball and its respective pad. During the mounting process, the IC is positioned in such a manner that the solder balls are aligned with the PCB's pads. Once aligned, a controlled heat source may be applied to the assembly. The heat causes the solder balls to melt and flow, forming a bond with the corresponding pads on the PCB. Upon cooling, the solder solidifies, creating an electrically conductive connection between the IC and the PCB.

As shown in block 206, the method may include applying an underfill material comprising a detection agent between the IC and the PCB, such that the underfill material is in contact with the plurality of solder balls and the PCB. Typically, the underfill material is composed of a thermosetting resin that, once cured, forms a hard, mechanically supportive matrix around the solder ball connections. This matrix effectively redistributes mechanical stresses exerted on the solder balls, thereby reducing the likelihood of solder fatigue and potential fracture during the operational life of the assembly.

In some embodiments, the detection agent may be uniformly dispersed throughout the underfill material. When exposed to an external environment, the detection agent may be configured to change a state of the IC, in some cases indicating that the IC may have been subjected to tampering. In example embodiments, in addition to oxidization agents and chemical agents, the detection agent may include conductive micro-particles that may be configured to bridge critical electrical pathways and initiate short circuits should the underfill be disturbed. In other examples, the underfill material may include one or more thermally reactive compounds that adversely react to excessive heat from tampering attempts, photosensitive compounds that are sensitive to specific light wavelengths, piezoelectric materials that produce a voltage when mechanically stressed, and/or the like.

Many modifications and other embodiments of the present disclosure set forth herein will come to mind to one skilled in the art to which these embodiments pertain having the benefit of the teachings presented in the foregoing descriptions and the associated drawings. Although the figures only show certain components of the methods and systems described herein, it is understood that various other components may also be part of the disclosures herein. In addition, the method described above may include fewer steps in some cases, while in other cases may include additional steps. Modifications to the steps of the method described above, in some cases, may be performed in any order and in any combination.

Therefore, it is to be understood that the present disclosure is not to be limited to the specific embodiments disclosed and that modifications and other embodiments are intended to be included within the scope of the appended claims. Although specific terms are employed herein, they are used in a generic and descriptive sense only and not for purposes of limitation.

INCORPORATION BY REFERENCE

To supplement the present disclosure, this application further incorporates entirely by reference the following commonly assigned patent applications:

| U.S. Patent Application Ser. No. | Title | Filed On |
|---|---|---|
| 18,242,316 | SECURITY CHIP FOR ENSURING THE PHYSICAL INTEGRITY OF AN INTEGRATED CIRCUIT | Filed Concurrently Herewith |

What is claimed is:

1. A secure electronic component assembly, comprising:

a printed circuit board (PCB);

an integrated circuit (IC) mounted on the PCB;

an underfill material disposed between the IC and the PCB; and a detection agent configured to change a state of the IC in response to exposure to an external environment, wherein the change in the state of the IC is indicative of a tamper condition, and wherein the detection agent is micro-encapsulated.

2. The assembly of claim 1, wherein the change in the state of the IC comprises a change from a functional state of the IC to a non-functional state of the IC.

3. The assembly of claim 2, wherein the non-functional state of the IC is caused by a short-circuit between one or more internal connections in the IC.

4. The assembly of claim 2, wherein the non-functional state of the IC is caused by physical degradation of the IC.

5. The assembly of claim 2, wherein the non-functional state of the IC is caused by an alteration in one or more electrical properties of the IC.

6. The assembly of claim 1, wherein the detection agent comprises at least one of an oxidization agent or a chemical agent.

7. The assembly of claim 1, wherein the detection agent is configured to change a chromatic appearance of the IC in response to exposure to the external environment, and wherein the change of the chromatic appearance is indicative of a tamper condition.

8. The assembly of claim 1, further comprising:

a plurality of solder balls operatively coupled to the IC, wherein the plurality of solder balls is configured for physical and electrical connection between the IC and the PCB.

9. The assembly of claim 8, wherein the underfill material, once cured, encapsulates the plurality of solder balls, forming a mechanical and thermal bridge that provides mechanical reinforcement, stress redistribution, and enhanced thermal conductivity between the IC and the PCB.

10. A method for making a secure electronic component assembly, the method comprising:

providing a printed circuit board (PCB) comprising a plurality of pads;

mounting an integrated circuit (IC) onto the PCB by positioning a plurality of solder balls in alignment with the plurality of pads and disposing the IC on the plurality of solder balls so as to operatively couple the IC and the PCB; and applying an underfill material comprising a detection agent between the IC and the PCB, such that the underfill material is in contact with the plurality of solder balls and the PCB, wherein the detection agent is configured to change a state of the IC in response to exposure to an external environment, wherein the change in the state of the IC is indicative of a tamper condition, and wherein the detection agent is micro-encapsulated.

11. The method of claim 10, wherein the change in the state of the IC comprises a change from a functional state of the IC to a non-functional state of the IC.

12. The method of claim 11, wherein the non-functional state of the IC is caused by a short-circuit between one or more internal connections in the IC.

13. The method of claim 11, wherein the non-functional state of the IC is caused by physical degradation of the IC.

14. The method of claim 11, wherein the non-functional state of the IC is caused by an alteration in one or more electrical properties of the IC.

15. The method of claim 10, wherein the detection agent comprises at least one of an oxidization agent or a chemical agent.

16. The method of claim 10, wherein the detection agent is configured to change a chromatic appearance of the IC in response to exposure to the external environment, and wherein the change of the chromatic appearance is indicative of a tamper condition.

17. The method of claim 10, wherein the underfill material, once cured, encapsulates the plurality of solder balls, forming a mechanical and thermal bridge that provides mechanical reinforcement, stress redistribution, and enhanced thermal conductivity between the IC and the PCB.

18. The method of claim 10, wherein the method further comprises:

applying the underfill material in a liquid state; and curing the underfill material to transition the underfill material from the liquid state to a solid state.

* * * * *